United States Patent
Oh et al.

(10) Patent No.: US 7,321,144 B2
(45) Date of Patent: Jan. 22, 2008

(54) SEMICONDUCTOR DEVICE EMPLOYING BURIED INSULATING LAYER AND METHOD OF FABRICATING THE SAME

(75) Inventors: Chang-Woo Oh, Gyeonggi-do (KR); Dong-Gun Park, Gyeonggi-do (KR); Jeong-Dong Choe, Gyeonggi-do (KR); Kyoung-Hwan Yeo, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 255 days.

(21) Appl. No.: 11/011,258

(22) Filed: Dec. 13, 2004

(65) Prior Publication Data

US 2005/0133881 A1   Jun. 23, 2005

(30) Foreign Application Priority Data

Dec. 18, 2003   (KR) .................. 10-2003-0093437

(51) Int. Cl.
*H01L 27/108*   (2006.01)
*H01L 29/76*   (2006.01)
*H01L 29/94*   (2006.01)
*H01L 31/119*   (2006.01)

(52) U.S. Cl. ............. 257/296; 438/238; 257/306; 257/E27.084; 257/E27.086

(58) Field of Classification Search .......... 257/71, 257/295–296, 347, E27.084, E27.086, E27.075
See application file for complete search history.

(56) References Cited

U.S. PATENT DOCUMENTS 5,936,277 A * 8/1999 Takeuchi .................. 257/336
6,407,427 B1 * 6/2002 Oh ........................... 257/347
6,429,091 B1 * 8/2002 Chen et al. ................ 438/423
6,514,809 B1 * 2/2003 Xiang ....................... 438/214
2002/0052077 A1 * 5/2002 Tee et al. .................. 438/239
2002/0097608 A1 * 7/2002 Skotnicki et al. ...... 365/185.27

FOREIGN PATENT DOCUMENTS

KR   2001-0045580   6/2001

OTHER PUBLICATIONS

English language abstract of Korean Publication No. 2001-0045580.

(Continued)

*Primary Examiner*—Theresa T. Doan
*Assistant Examiner*—Sarah K. Harding
(74) *Attorney, Agent, or Firm*—Marger Johnson & McCollom, P.C.

(57) ABSTRACT

A semiconductor device employs an asymmetrical buried insulating layer, and a method of fabricating the same. The semiconductor device includes a lower semiconductor substrate. An upper silicon pattern is located on the lower semiconductor substrate. The upper silicon pattern includes a channel region, and a source region and a drain region spaced apart from each other by the channel region. A gate electrode is electrically insulated from the upper silicon pattern and intersects over the channel region. A bit line and a cell capacitor are electrically connected to the source region and the drain region, respectively. A buried insulating layer is interposed between the drain region and the lower semiconductor substrate. The buried insulating layer has an extension portion partially interposed between the channel region and the lower semiconductor substrate.

12 Claims, 7 Drawing Sheets

OTHER PUBLICATIONS

Tsutomu Sato, et al., "Son (Silicon on Nothing) MOSFET Using ESS ( Empty Space in Silicon) Technique for SoC applications" IEEE 2001, 4 pages.

S. Monfray, et al., "First 80nm SON (Silicon-On-Nothing MOSFETs With Perfect Morphology and High Electrical Performance" IEEE 2001 4 pages.

S. Monfray, et al., "50nm-Gate All Around (GAA)-Silicon On Nothing (SON)-Devices: A Simple Way to Co-Integration of GAA Transistors Within Bulk MOSFET Process" IEEE 2002, 2 pages.

S. Monfray, et al., "SON (Silicon-On-Nothing) P-MOSFETs With Totally Silicided (CoSi2) Polysilicon On The Simplest Way to Integration of Metal Gates on Thin FD Channels", IEEE 2002, 4 pages.

* cited by examiner

SEMICONDUCTOR DEVICE EMPLOYING BURIED INSULATING LAYER AND METHOD OF FABRICATING THE SAME

CROSS-REFERENCE TO RELATED APPLICATION

This application claims the benefit of Korean Patent Application No. 2003-93437, filed Dec. 18, 2003, the disclosure of which is hereby incorporated herein by reference in its entirety.

BACKGROUND

1. Technical Field

The present invention relates to a semiconductor device and a method of fabricating the same, and more particularly, to a DRAM cell employing an asymmetrical buried insulating layer and a method of fabricating the same.

2. Discussion of the Related Art

A semiconductor device widely employs a discrete device such as a MOS transistor as a switching device. With the increase of high integration of the semiconductor device, the MOS transistor is gradually scaled down. As a result, a channel length of the MOS transistor is reduced and a short channel effect (SCE) becomes a problem. Therefore, a channel ion concentration should inevitably be increased in order to reduce the short channel effect However this causes an increase of a leakage current, thereby deteriorating refresh characteristics.

Therefore, transistors having an SOI structure are widely studied to improve the short channel effect. The SOI structure includes a lower semiconductor substrate, an upper silicon pattern, and a buried insulating layer interposed between the lower semiconductor substrate and the upper silicon pattern, and insulating the lower semiconductor substrate from the upper silicon pattern. The transistor having the SOI structure has capabilities to reduce a short channel effect and a parasitic capacitance, and operates at high speed while power consumption is small. However, it has a problem of a floating body effect such as a kink effect.

In order to solve the problems related with the floating body effect, a new method has been introduced and studied on a technique of electrically connecting the upper silicon pattern region and the lower semiconductor substrate. Further, a method of electrically connecting the upper silicon pattern region and the lower semiconductor substrate is disclosed in U.S. Pat. No. 6,429,091, titled "Patterned Buried Insulator" to Chen, et. al.

In the method disclosed in U.S. Pat. No. 6,429,091, a mask is formed on a semiconductor substrate, and buried doping regions are formed under source/drain regions. Selectively etching the doping regions, and filling an insulator, a buried insulating layer is formed. Then, a transistor has the source/drain regions formed on the top of the buried insulating layer. As a result, patterned buried insulating layers are formed interposed under the source/drain regions, thereby reducing a junction leakage current and improving a floating body effect.

In order to further reduce the junction leakage current, the buried insulating layers need to be extended under the gate electrode, spaced apart from one another. In the above method, in order to form the buried insulating layers extended under the gate electrode, it is necessary to form a mask having a width smaller than that of the gate electrode. However, it is quite difficult to form patterns having a smaller width than that of the gate electrode due to the demand of highly integrated semiconductor devices. Thus, it is also difficult to make buried insulating layers aligned with a smaller gap than the width of the gate electrodes.

Further, in the above method, the gate electrodes may be misaligned with the buried insulating layers. The DRAM device typically has two transistors and two cell capacitors inside one active region. That is, in the DRAM device, two adjacent cells on one active region may be referred to as one unit. The two cells commonly have one bit line. The two cells are required to have identical characteristics. However, due to the above misalignment, the two cells may show different characteristics. Therefore, the buried insulating layers and the gate electrodes require an alignment margin.

As a result, with a high integration of a semiconductor device, using the method disclosed in the U.S. Pat. No. 6,429,091, there is a limitation in forming DRAM cells being capable of minimizing a leakage current and having an alignment margin.

SUMMARY OF THE INVENTION

Therefore, the present invention is directed to provide a semiconductor device such as a DRAM cell employing a patterned buried insulating layer, to minimize a leakage current and to ensure an alignment margin of the buried insulating layer and the gate electrode.

Further, the invention is directed to provide a method of fabricating a semiconductor device such as a DRAM cell employing an asymmetrical buried insulating layer with respect to a transistor, to minimize a leakage current.

In accordance with an exemplary embodiment, the present invention provides a DRAM cell employing an asymmetrical buried insulating layer. The DRAM cell includes a lower semiconductor substrate. An upper silicon pattern is located on the lower semiconductor substrate. The upper silicon pattern includes a channel region, and a source region and a drain region spaced apart from each other by the channel region. Further, a gate electrode is electrically insulated from the upper silicon pattern and intersects over the channel region. Further, a bit line and a cell capacitor are electrically connected to the source region and the drain region, respectively. A buried insulating layer is interposed between the drain region, electrically connected to the cell capacitor, and the lower semiconductor substrate. The buried insulating layer has an extension portion partially interposed between the channel region and the lower semiconductor substrate. Therefore, an alignment margin can be ensured in order to align the gate electrode on the buried insulating layer, and a leakage current of a cell capacitor can be prevented as well as a floating body effect.

Preferably, the upper silicon pattern may be a silicon epitaxial layer. Further, the buried insulating layer may be a silicon oxide layer, or stacked layers consisting of a silicon oxide layer and a silicon nitride layer.

Further, the source region and the drain region are determined in accordance with the operation of a DRAM cell, and hereinafter, an impurity region, electrically connected with the bit line, is defined as the source region, and another impurity region, electrically connected with the cell capacitor, is defined as the drain region. The source region preferably has an impurity concentration higher than that of the drain region. Further, the source region has a junction depth greater than that of the drain region, and can be extended to the lower semiconductor substrate. Therefore, junction resistances of the bit line and the source region can be reduced, thereby improving the operation speed.

In accordance with another exemplary embodiment, the present invention provides a method of fabricating a DRAM cell employing an asymmetrical buried oxide layer. The method includes forming a sacrificial layer on a lower semiconductor substrate. Patterning the sacrificial layer, an opening exposing the lower semiconductor substrate is formed, and an upper silicon epitaxial layer is formed on the semiconductor substrate having the opening.

Then, patterning the upper silicon epitaxial layer, the sacrificial layer, and the lower semiconductor substrate, a trench is formed for defining an active region. The active region includes an upper silicon pattern intersecting over the exposed lower semiconductor substrate, and sacrificial layer patterns exposed on sidewalls of the trench. Then, selectively removing the exposed sacrificial layer patterns, and forming a buried insulating layer and an isolation layer, respectively, to fill empty spaces, from which the sacrificial layer patterns are removed, and the trench. Gate electrodes are formed on the semiconductor substrate having the isolation layer formed thereon, insulated from the upper silicon pattern, and intersecting the upper silicon pattern. The gate electrodes are formed spaced apart from one another and passing over opening sidewalls that face each other. N-type impurity ions are implanted using the gate electrodes as ion implantation masks to form a source region and a drain region. The drain region is located above the buried insulating layer. Then a bit line and a cell capacitor are formed that are electrically connected with the source region and the drain region, respectively.

Preferably, the sacrificial layer may be an SiGe epitaxial layer. After forming the SiGe epitaxial layer, a lower silicon epitaxial layer may be formed on the SiGe epitaxial layer.

Further, the opening for exposing the semiconductor substrate may be a hole or a line-shaped groove. In the case that the opening is a hole, a narrow width of the upper silicon pattern is preferably confined to an upper surface of the semiconductor substrate exposed via the hole. Therefore, the formation of the buried oxide layer under the source region is prevented.

Further, the gate electrodes are formed to have a width being smaller than that of the opening. That is, the opening is formed to have a greater width than that of the gate electrode. Thus, the opening can be formed relatively easily.

Preferably, before or after forming the source/drain regions, a photoresist pattern having an opening is formed on the semiconductor substrate having the gate electrodes formed thereon, and the opening exposes an upper surface of the active region between the gate electrodes. The active region between the gate electrodes means a source region. Then, N-type impurity ions are injected using the photoresist pattern and the gate electrodes as ion implantation masks. Therefore, since an impurity ion concentration of the source region is higher than that of the drain region, a junction resistance of the bit line can be reduced.

According to embodiments of the present invention, a floating body effect problem can be solved, and leakage current characteristics of the semiconductor device can be improved.

BRIEF DESCRIPTION OF THE DRAWINGS

The above and other features and advantages of the invention will become more apparent to those of ordinary skill in the art by describing in detail preferred embodiments thereof with reference to the attached drawings in which.

DETAILED DESCRIPTION OF THE PREFERRED EMBODIMENTS

Figure 1:
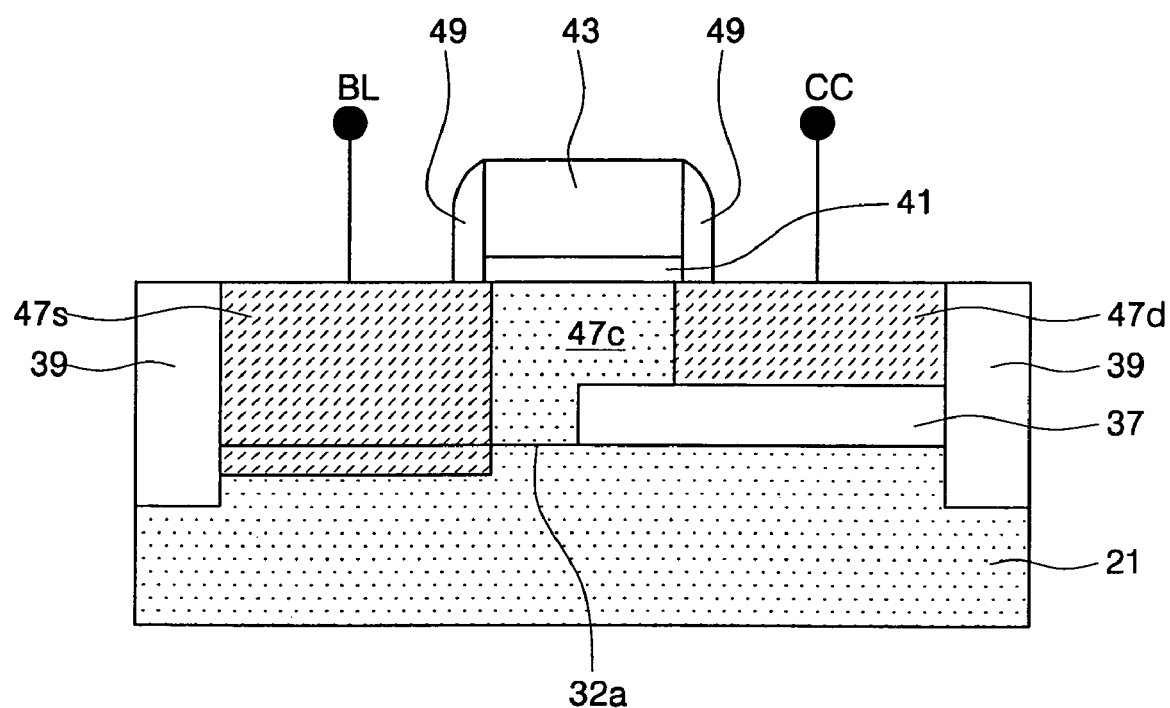
FIG. 1 is a sectional view to illustrate a DRAM cell according to one embodiment of the invention.

The invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

FIG. 1 is a sectional view to illustrate a DRAM cell according to one embodiment of the invention.

Referring to FIG. 1, an upper silicon pattern 32a is located on a lower semiconductor substrate 21. The lower semiconductor substrate 21 may be a single crystal silicon substrate. The upper silicon pattern 32a may be a silicon epitaxial layer. An isolation layer 39 may cover the sidewalls of the upper silicon pattern 32a. The isolation layer 39 defines an active region of a DRAM cell. The isolation layer 39 is extended into the lower semiconductor substrate 21.

The upper silicon pattern 32a includes a channel region 47c, and a source region 47s and a drain region 47d spaced by the channel region 47c. In the DRAM cell using an NMOS transistor, the source/drain regions 47s, 47d are N-type impurities-doped regions and the channel region 47c is a P-type impurities-doped region.

Preferably, a concentration of impurities of the source region 47s may be higher than that of the drain region 47d. Further, the source region 47s may be vertically extended to include a portion of the lower semiconductor substrate 21.

Further, a gate electrode 43 is electrically insulated from the upper silicon pattern 32a, and is located on top of the channel region 47c. The gate electrode 43 is insulated from the upper silicon pattern 32a by a gate insulating layer 41. Further, spacers 49 may cover the sidewalls of the gate electrode 43.

A bit line BL is electrically connected to the source region 47s, and a cell capacitor CC is electrically connected to the drain region 47d. The bit line BL functions to convey charges and the cell capacitor CC functions to store charges. Further, the source region 47s may have an impurity concentration being higher than that of the drain region 47d. That is, a junction resistance of the bit line BL may be lower than that of the cell capacitor CC, and an operation speed of a DRAM cell may be improved.

A buried insulating layer 37 is interposed between the drain region 47d and the lower semiconductor substrate. The buried insulating layer 37 may be a silicon oxide layer ($SiO_2$), and may be stacked layers of the silicon oxide layer and a silicon nitride layer (SiN). Further, the buried insulating layer 37 may include an empty space. The buried insulating layer 37 may have an extension portion which is partially interposed between the channel region 47c and the lower semiconductor substrate 21. That is, the extension portion is shorter than a length of the channel region 47c. The length of the extension portion is preferably equal to or shorter than ½ a length of the channel region 47c in the longitudinal direction of the channel region. Thus, the channel region 47c may be physically connected with the lower semiconductor substrate 21. Thus, the DRAM cell can prevent the generation of a floating body effect suffered by the transistor having an SOI structure.

Further, the buried insulating layer 37 reduces a junction area of the drain region 47d. Further, the extension portion of the buried insulating layer 37 reduces an intensity of the electric field generated between the drain region 47d and the channel region 47c. The reduction of the junction area of the drain region 47d, and the reduction of the intensity of the electrical field lead to the reduction of a leakage current. Thus, while the cell capacitor CC stores charges, the leakage current may be prevented.

Further, the effect on leakage currents due to the length of the extension portion is smaller than the effect on leakage currents due to the junction area of the drain region 47d. Therefore, when the extension portion is formed with an appropriate length, the alignment margin of the buried insulating layer 37 and the gate electrode 43 may be increased.

Now hereinafter, a method of fabricating a DRAM cell according to a preferred embodiment of the invention will be described in reference to accompanying drawings.

Figure 2:
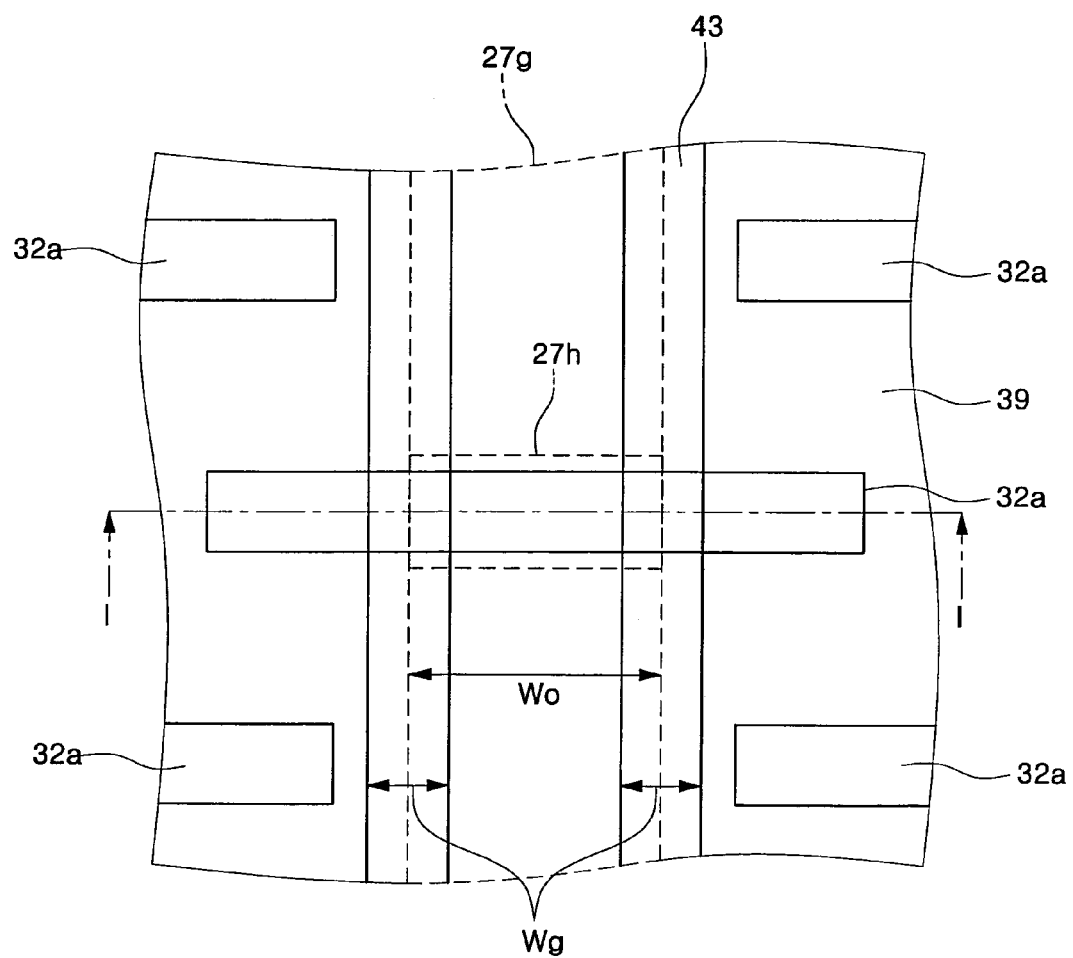
FIG. 2 depicts a layout to illustrate a method of fabricating a DRAM cell according to a preferred embodiment of the invention.

FIG. 2 depicts a layout to illustrate a method of fabricating a DRAM cell according to a preferred embodiment of the invention, and FIGS. 3 to 11 are sectional views taken along a line of I-I of FIG. 2 to illustrate a method of fabricating a DRAM cell according to a preferred embodiment of the invention.

Figure 3:
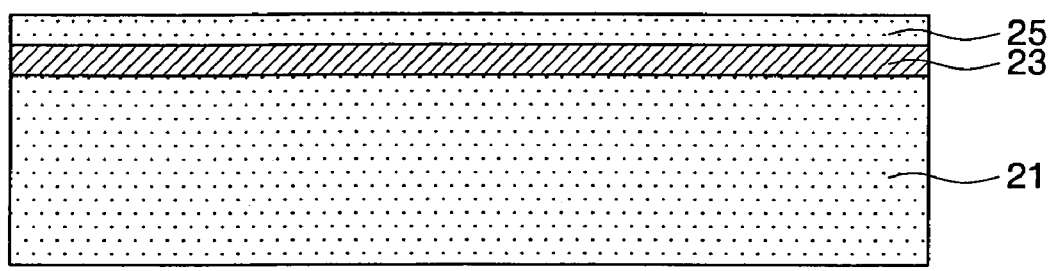
FIGS. 3 to 11 are sectional views taken along a line of I-I of FIG. 2 to illustrate a method of fabricating a DRAM cell according to a preferred embodiment of the invention.

Referring to FIGS. 2 and 3, a sacrificial layer 23 is formed on a lower semiconductor substrate 21. The lower semiconductor substrate 21 may be a single crystal silicon substrate. Further, the sacrificial layer 23 is formed of a material having a lattice constant equal to or closer to that of silicon. Preferably, the sacrificial layer 23 may be an SiGe epitaxial layer. A lower silicon epitaxial layer 25 may be sequentially formed on the sacrificial layer 23. The lower silicon epitaxial layer 25 prevents the upper surface of the sacrificial layer 23 from being exposed in a subsequent process.

Figure 4:
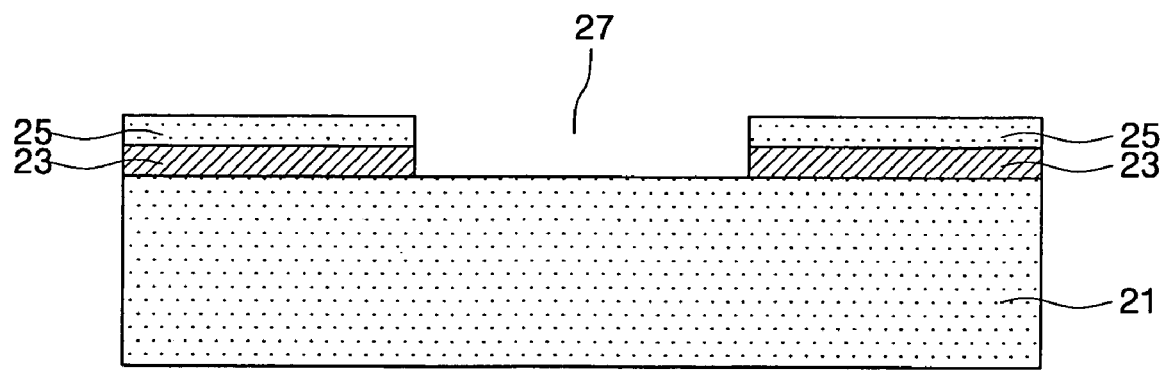

Referring to FIGS. 2 and 4, the lower silicon epitaxial layer 25 and the sacrificial layer 23 are patterned, so as to form an opening 27 exposing the lower semiconductor substrate 21. A hard mask layer (not shown) may be formed on the lower silicon epitaxial layer 25 to form the opening 27. The hard mask layer is patterned, so as to form a hard mask pattern having an opening exposing the lower silicon epitaxial layer 25. Then, using the hard mask pattern as an etch mask, the lower silicon epitaxial layer 25 and the sacrificial layer 23 are sequentially etched, so as to form an opening 27 exposing the lower semiconductor substrate 21. Then, the hard mask pattern is removed.

As shown in FIG. 2 with a dotted line, the opening 27 may be a line-shaped groove 27g or hole 27h. The opening 27 may be formed to have a predetermined width Wo in one direction. The sacrificial layer 23 and the lower silicon epitaxial layer 25 may be exposed on the sidewalls of the opening 27.

Figure 5:
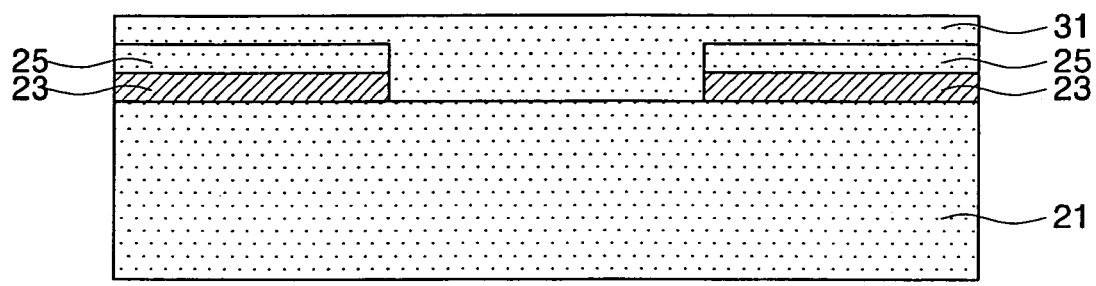

Referring to FIGS. 2 and 5, an upper silicon epitaxial layer 31 is formed on the semiconductor substrate having the opening 27 formed thereon. The upper silicon epitaxial layer 31 fills the opening 27 on the exposed top of the semiconductor substrate 21, and covers the upper surface of the lower silicon epitaxial layer 25. If the sacrificial layer 23 is formed of an SiGe epitaxial layer, the upper silicon epitaxial layer 31 may be uniformly formed on the SiGe epitaxial layer. Therefore, a defect-free silicon epitaxial layer may be formed inside the opening 27. Thus, the upper surface of the upper silicon epitaxial layer 31 may be formed flat, and may be formed to have a step difference due to the opening 27.

Figure 6:
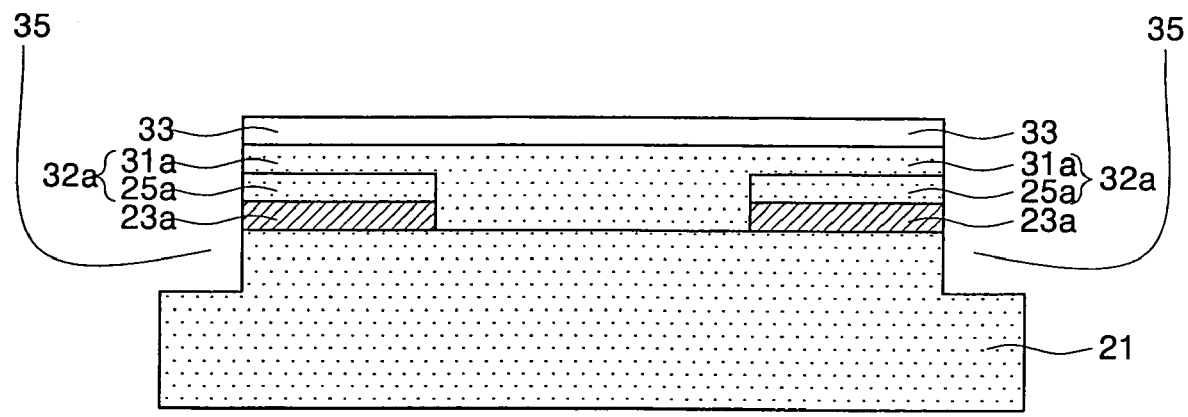

Referring to FIGS. 2 and 6, the upper silicon epitaxial layer 31, the lower silicon epitaxial layer 25, the sacrificial layer 23, and the lower semiconductor substrate 21 are sequentially patterned, so as to form a trench 35 to define the active region. The active region includes an upper silicon pattern 32a intersecting over the lower semiconductor substrate 21 exposed by the opening 27, and the sacrificial layer pattern 23a exposed on the sidewalls of the trench 35. The upper surface of the upper silicon pattern 32a will be the upper surface of the active region.

The upper silicon pattern 32a includes lower silicon epitaxial patterns 25a and upper silicon epitaxial patterns 31a. Further, the sacrificial layer patterns 23a are formed under the lower silicon epitaxial layer patterns 25a. The sacrificial layer patterns 23a may be formed to face each other about the opening 27.

Preferably, a hard mask pattern 33 may be formed in order to form the trench 35. Using the hard mask pattern 33 as an etch mask, the upper silicon epitaxial layer 31, the lower silicon epitaxial layer 25, the sacrificial layer 23 and the lower semiconductor substrate 21 are etched, so as to form the trench 35.

Figure 7:
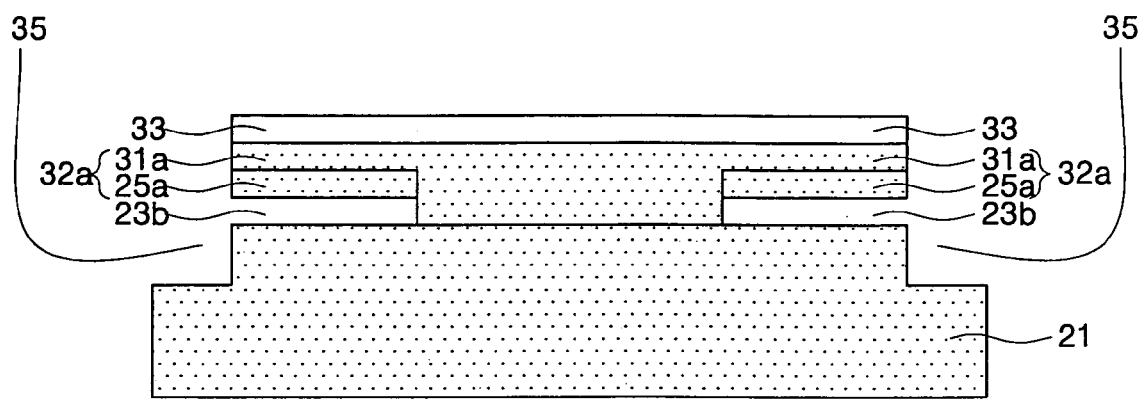

Referring to FIGS. 2 and 7, the exposed sacrificial layer patterns 23a are selectively etched and removed. The sacrificial layer patterns 23a are selectively etched using a wet etch technology. Since the sacrificial layer patterns 23a are removed, empty spaces 23b are formed where the sacrificial layer patterns 23a are previously formed.

Figure 8:
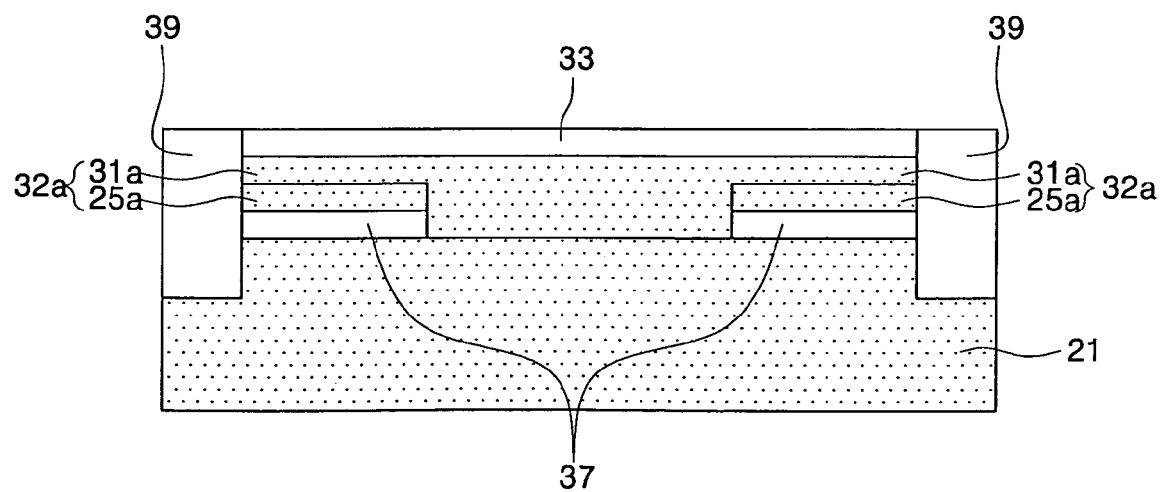

Referring to FIGS. 2 and 8, a buried insulating layer 37 is formed in the empty spaces 23b from which the sacrificial layer patterns 23a are removed. The buried insulating layer 37 may be formed of empty spaces, the silicon oxide layer, or the silicon nitride layer, and may be formed by stacking these layers. Preferably, a silicon oxide layer is formed to cover the inner sidewalls of the empty spaces 23b, and then, a silicon nitride layer is formed. As a result, the silicon nitride layer is enclosed by the silicon oxide layer, so as to form a buried insulating layer 37. Herein, the insulating layers may be formed on the inner walls of the trench 35. Then, an insulating layer is formed to fill the trench 35, and the hard mask pattern 33 is planarized until its upper surface is exposed, so as to form an isolation layer 39 to fill the trench 35. The isolation layer 39 covers the sidewalls of the upper silicon pattern 32a and the sidewalls of the buried insulating layer 37. Herein, the hard mask pattern 33 functions to protect the upper surface of the upper silicon pattern 32a.

Further, after the empty spaces 23b are formed, the isolation layer 39 can be formed without filling the empty spaces 23b. Preferably, before the isolation layer 39 is formed, a high temperature oxide layer can be formed on the sidewalls of the empty spaces 23b and the sidewalls of the trench 35. The high temperature oxide layer protects the sidewalls of the empty spaces and the sidewalls of the trench 35. As a result, the buried insulating layer 37 includes the empty space.

Figure 9:
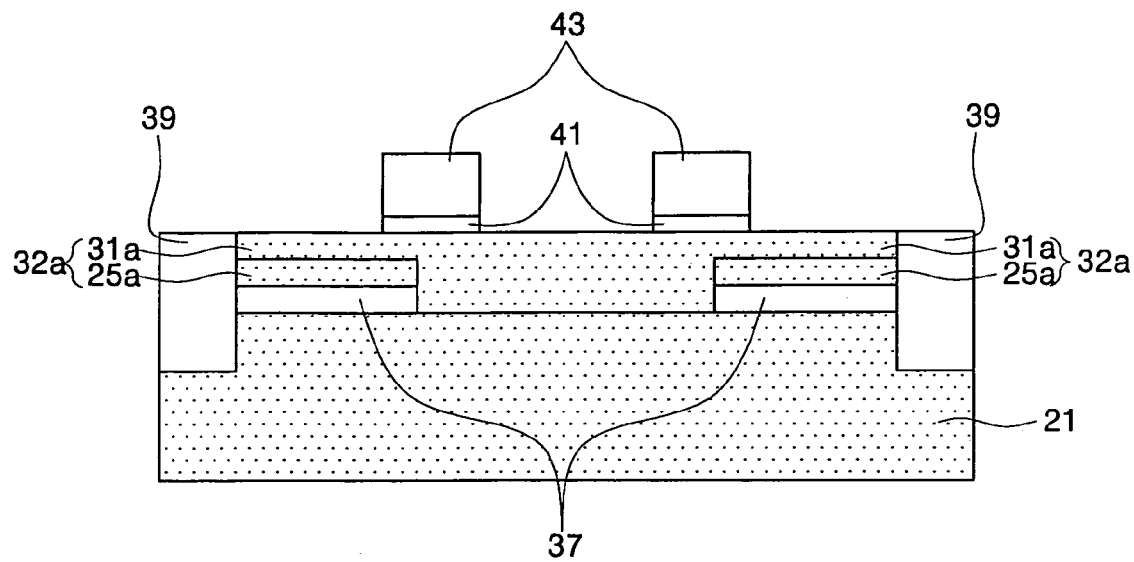

Referring to FIGS. 2 and 9, after the isolation layer 39 is formed, the hard mask pattern 33 is removed. Then, gate electrodes 43 are formed insulated from the upper silicon pattern 32a and intersecting the upper silicon pattern 32a. The gate electrodes 43 may be insulated from the upper silicon pattern 32a by the gate insulating layer 41. Further, the gate electrodes 43 are formed to pass over opening sidewalls facing each other. Preferably, the gate electrodes 43 may be formed to have a width smaller than that of the opening 27. That is, the opening 27 may be formed to have a width being relatively greater than those of the gate electrodes 43. Thus, the opening 27 can be easily formed, by patterning the sacrificial layer 23.

Further, before the gate electrodes 43 are formed, P-type channel ions can be injected. The channel ions may be implanted in order to control a threshold voltage.

Figure 10:
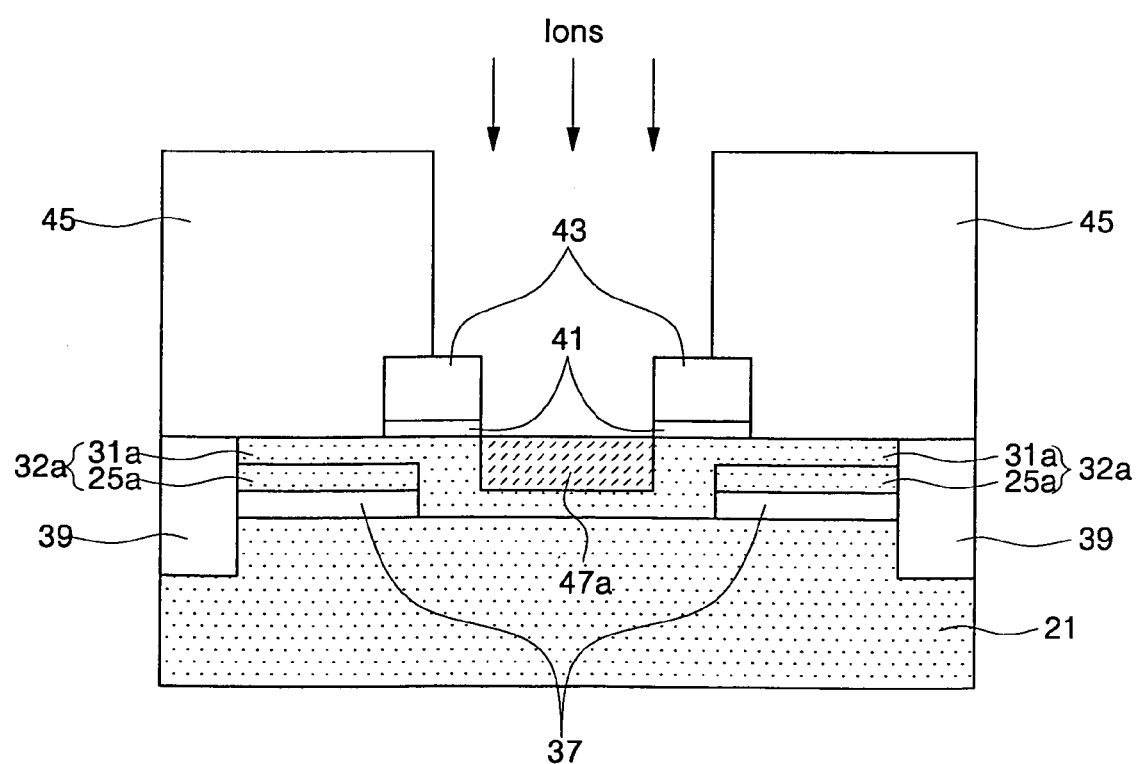

Referring to FIGS. 2 and 10, a photoresist pattern 45 may be formed on the semiconductor substrate having the gate electrodes 43 formed thereon, so as to expose the active region between the gate electrodes 43. N-type impurity ions are implanted using the photoresist pattern 45 and the gate electrodes 43 as ion implantation masks, so as to form another impurity region 47a inside the active region.

Figure 11:
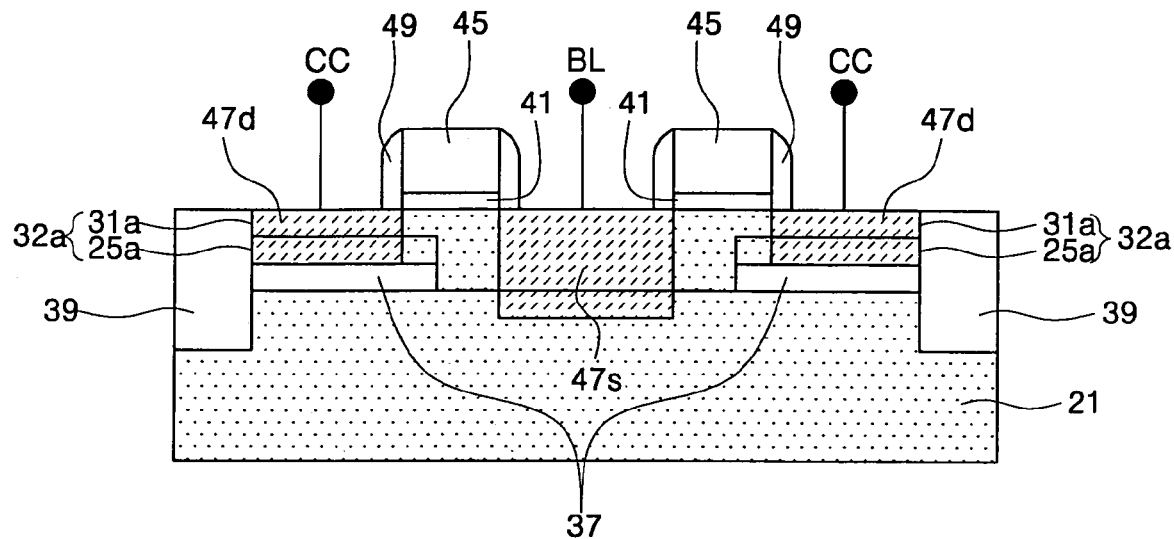

Referring to FIGS. 2 and 11, N-type impurity ions are implanted inside the active region using the gate electrodes 43 as ion implantation masks, so as to form the source region 47s and the drain region 47d. The source/drain regions 47s, 47d may be formed using a typical LDD process. That is, low concentration impurity regions are formed by implanting N-type impurity ions using the gate electrodes 43 as ion implantation masks. Then, the spacers 49 are formed to cover the sidewalls of the gate electrodes 43, and using the spacers 49 and the gate electrodes 43 as ion implantation masks, N-type impurity ions are implanted, so as to form high concentration impurity regions.

The process of forming another impurity region 47a (FIG. 10) may be performed after the operation of forming the source/drain regions 47s, 47d. Further, when another impurity region 47a is formed, the source region 47s has a relatively high impurity ion concentration and a greater junction depth compared with the drain regions 47d.

An interlayer insulating layer (not shown) is formed on the semiconductor substrate having the source/drain regions formed thereon, and contact plugs (not shown) are formed penetrating the interlayer insulating layer and connected with the source/drain regions 47s, 47d. Then, a bit line BL is formed to be connected with the source region 47s via the contact plug. Further, a cell capacitor CC is formed to be electrically connected with the drain regions 47d via the contact plugs. The bit line BL and the cell capacitors CC are electrically insulated from each other.

According to one preferred embodiment of the invention, a buried insulating layer 37 may be formed under the drain region 47d electrically connected with the cell capacitor CC. The buried insulating layer 37 extends under the gate electrodes 43. Therefore, the charge leakage of the cell capacitor CC can be prevented, and the alignment margin of the buried insulating layer 37 and the gate electrodes 43 can be ensured. Further, the opening 27 may be formed to have a width greater than those of the gate electrodes 43. Thus, the opening 27 can be easily formed, by patterning the sacrificial layer 23.

Figure 12:
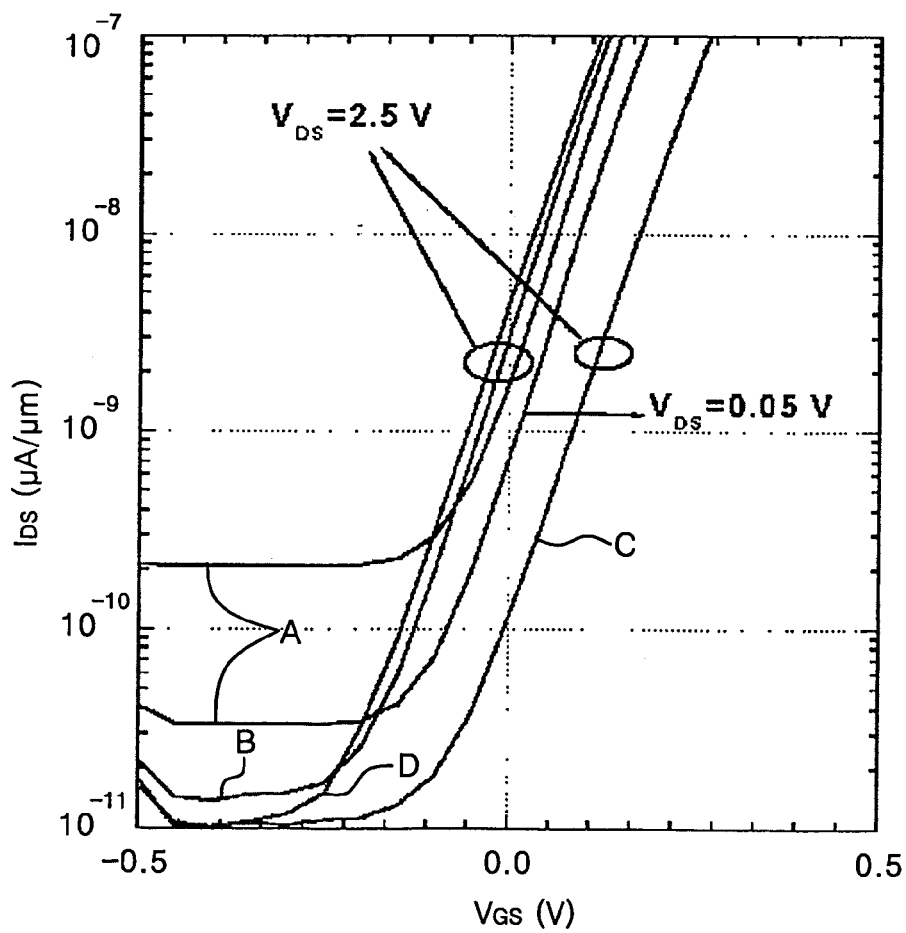
FIG. 12 is a graph showing the leakage currents of a specimen fabricated according to a preferred embodiment of the invention, to illustrate the leakage current characteristics of a DRAM cell, in which the interposition locations of respective buried insulating layers in the specimen are varied.

FIG. 12 is a graph showing the leakage currents of a specimen to illustrate the leakage current characteristics of a DRAM cell, in which the interposition locations of respective buried insulating layers in the specimen are varied. Herein, the structural differences of the specimen are presented in Table 1.

TABLE 1

|  | Specimen A | Specimen B | Specimen C | Specimen D |
|---|---|---|---|---|
| 1. formation of a buried insulating layer | X | O | O | O |
| 2. location of a buried insulating layer | — | Under source/drain regions | Under source/drain and channel regions | Under drain region and channel region |
| 3. overlap extent of a buried insulating layer and a gate electrode | — | — | 0.5 Wg | 0.5 Wg |
| 4. minimum distance between buried insulating layers | — | Wg | 0.5 Wg | 2 Wg |

Referring to Table 1, specimen A is a planar transistor without a buried insulating layer, and specimen B is fabricated, in which buried insulating layers are spaced as much as the width of the gate electrode, and formed under the source/drain regions. Specimen C is fabricated, in which buried insulating layers are spaced as much as ½ the width Wg of the gate electrode, and formed under the source/drain regions and the channel region. Further, specimen D is fabricated, in which a buried insulating layer is located under the drain region, and is partially extended to the channel region. Each specimen employs a drain electrode instead of a cell capacitor CC.

In the specimen B, C, and D employing the buried insulating layer, the minimum distance between the buried insulating layers is the greatest in the specimen D. Further, the minimum distance between the buried insulating layers is related with a width Wo of the opening 27 (FIG. 4). Thus, among the specimen B, C, and D, the formation of the buried insulating layer is easiest in the specimen D.

Further, in the specimen, the source region and the lower semiconductor substrate are grounded, and a drain voltage $V_{DS}$ is fixed. While increasing a gate voltage $V_{GS}$, an electric current IDS flowing in the drain electrode is measured.

Referring to FIG. 12, when the drain voltage $V_{DS}$ is 2.5 V, an off-state current of the specimen A is greatest, and an off-state current of the specimen C is least. Further, the specimen B and D do not show a great difference in off-state current, but the specimen D shows a slightly low off-state current. The specimen A shows a relatively high off-state current at 0.05 V of the drain voltage.

As a result, employing buried insulating layers, the off-state current can be reduced, and since the buried insulating layers are extended to the channel region, the off-state current can be further reduced.

The off-state current is related with a leakage of the charges stored in the capacitor of the DRAM cell. Thus, a buried insulating layer is formed under the drain region into which the capacitor is electrically connected, thereby preventing a leakage current of the capacitor.

According to the invention, a patterned buried insulating layer is employed near a drain region into which a cell capacitor is electrically connected, thereby providing a DRAM cell being capable of ensuring an alignment margin of the buried insulating layer and the gate electrode, and minimizing a leakage current. Further, the buried insulating layer is formed using a sacrificial layer such as an SiGe epitaxial layer, thereby providing a method of fabricating a DRAM cell being capable of ensuring an alignment margin of the buried insulating layer and the gate electrodes, and minimizing a leakage current.

While the invention has been particularly shown and described with reference to exemplary embodiments thereof, it will be understood by those skilled in the art that the foregoing and other changes in form and details may be made therein without departing from the spirit and scope of the invention as defined in the following claims.

What is claimed is:

1. A semiconductor device comprising:
a lower semiconductor substrate;
an upper silicon pattern located on the lower semiconductor substrate, and the upper silicon pattern including a channel region;
a source region and a drain region spaced apart from each other by the channel region;
a gate electrode electrically insulated from the upper silicon pattern and extending across the channel region;
a bit line and a cell capacitor electrically connected to the source region and the drain region respectively; and
a buried insulating layer interposed between the drain region and the lower semiconductor substrate, the buried insulating layer having an extension portion partially interposed between the channel region and the lower semiconductor substrate, wherein the source region extends below a lowermost region of the buried insulating layer and contacts the lower semiconductor substrate.

2. The semiconductor device according to claim 1, wherein the upper silicon pattern comprises a silicon epitaxial layer.

3. The semiconductor device according to claim 1, wherein the source region has an impurity concentration higher than that of the drain region.

4. The semiconductor device according to claim 1, wherein the source region is extended to an inner portion of the lower semiconductor substrate.

5. The semiconductor device according to claim 1, wherein the extension portion has a length equal to or smaller than about half the length of the channel region.

6. The semiconductor device according to claim 1, wherein the buried insulating layer comprises an empty space.

7. The semiconductor device according to claim 1, wherein the buried insulating layer comprises silicon oxide.

8. The semiconductor device according to claim 1, wherein the buried insulating layer comprises a silicon oxide layer and a silicon nitride layer, which are stacked.

9. The semiconductor device according to claim 1, wherein the semiconductor device comprises a DRAM cell.

10. A semiconductor device comprising:
a lower semiconductor substrate;
an upper silicon pattern located on the lower semiconductor substrate, and the upper silicon pattern including a channel region;
a source region and a drain region spaced apart from each other by the channel region;
a gate electrode electrically insulated from the upper silicon pattern and extending across the channel region;
a bit line and a cell capacitor electrically connected to the source region and the drain region respectively; and
a buried insulating layer interposed between the drain region and the lower semiconductor substrate, the buried insulating layer having an extension portion partially interposed between the channel region and the lower semiconductor substrate, wherein the source region is extended to an inner portion of the lower semiconductor substrate.

11. A semiconductor device comprising:
a lower semiconductor substrate;
an upper silicon pattern located on the lower semiconductor substrate, and the upper silicon pattern including a channel region;
a source region and a drain region spaced apart from each other by the channel region;
a gate electrode electrically insulated from the upper silicon pattern and extending across the channel region;
a bit line and a cell capacitor electrically connected to the source region and the drain region respectively; and
a buried insulating layer interposed between the drain region and the lower semiconductor substrate, the buried insulating layer having an extension portion partially interposed between the channel region and the lower semiconductor substrate, wherein the buried insulating layer comprises an empty space and wherein the lower semiconductor substrate is exposed to the empty space.

12. The semiconductor device according to claim 1, wherein the source region directly contacts the lower semiconductor substrate.

* * * * *

UNITED STATES PATENT AND TRADEMARK OFFICE
CERTIFICATE OF CORRECTION

PATENT NO.       : 7,321,144 B2                                            Page 1 of 1
APPLICATION NO.  : 11/011258
DATED            : January 22, 2008
INVENTOR(S)      : Chang-Woo Oh et al.

It is certified that error appears in the above-identified patent and that said Letters Patent is hereby corrected as shown below:

Column 9, line 42, claim 1 the word "channet" should read -- channel --.

Signed and Sealed this

Thirtieth Day of September, 2008

JON W. DUDAS
*Director of the United States Patent and Trademark Office*